(12) United States Patent
Chen et al.

(10) Patent No.: US 12,362,342 B2
(45) Date of Patent: *Jul. 15, 2025

(54) SEMICONDUCTOR PACKAGE

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 20 days.

This patent is subject to a terminal disclaimer.

(21) Appl. No.: 18/472,249

(22) Filed: Sep. 22, 2023

(65) Prior Publication Data

US 2024/0014199 A1 Jan. 11, 2024

Related U.S. Application Data

(63) Continuation of application No. 17/460,320, filed on Aug. 30, 2021, now Pat. No. 11,798,931.

(51) Int. Cl.
  *H01L 25/18* (2023.01)
  *H01L 23/00* (2006.01)
  *H01L 23/31* (2006.01)

(52) U.S. Cl.
  CPC .......... *H01L 25/18* (2013.01); *H01L 23/3107* (2013.01); *H01L 24/08* (2013.01); *H01L 24/32* (2013.01); *H01L 2224/08145* (2013.01); *H01L 2224/32145* (2013.01)

(58) Field of Classification Search
  CPC . H01L 25/18; H01L 23/3107; H01L 25/0652; H01L 25/16; H01L 2224/08145; H01L 2224/32145; H01L 2225/06534
  See application file for complete search history.

(56) References Cited

U.S. PATENT DOCUMENTS

| | | | |
|---|---|---|---|
| 9,964,719 B1* | 5/2018 | Razdan | H01L 24/03 |
| 11,798,931 B2* | 10/2023 | Chen | H01L 23/3107 |
| 2017/0092626 A1* | 3/2017 | Yuan | H01L 25/50 |
| 2019/0004247 A1* | 1/2019 | Huang | G02B 6/4214 |
| 2019/0131267 A1* | 5/2019 | Wang | H01L 23/49811 |
| 2020/0003975 A1* | 1/2020 | Yu | H01L 24/97 |
| 2020/0006088 A1* | 1/2020 | Yu | G02B 6/30 |
| 2020/0161284 A1* | 5/2020 | Iida | G02B 6/4214 |
| 2021/0223489 A1* | 7/2021 | Weng | H01L 24/16 |
| 2021/0302654 A1* | 9/2021 | Chen | H01L 24/83 |
| 2021/0313254 A1* | 10/2021 | Chen | H01L 23/49827 |

* cited by examiner

*Primary Examiner* — Bac H Au
(74) *Attorney, Agent, or Firm* — JCIPRNET

(57) ABSTRACT

A semiconductor package includes a first die including an optical coupler, a second die disposed on the first die, and a transparent encapsulation material disposed on the first die. The second die includes a substrate and a transparent portion disposed within the substrate and optically coupled to the optical coupler. The transparent encapsulation material extends along sidewalls of the substrate of the second die.

20 Claims, 10 Drawing Sheets

SEMICONDUCTOR PACKAGE

CROSS-REFERENCE TO RELATED APPLICATION

This application is a continuation application of and claims the priority benefit of a prior application Ser. No. 17/460,320, filed on Aug. 30, 2021. The entirety of the above-mentioned patent application is hereby incorporated by reference herein and made a part of this specification.

BACKGROUND

The semiconductor industry has experienced rapid growth due to continuous improvements in the integration density of a variety of circuit components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
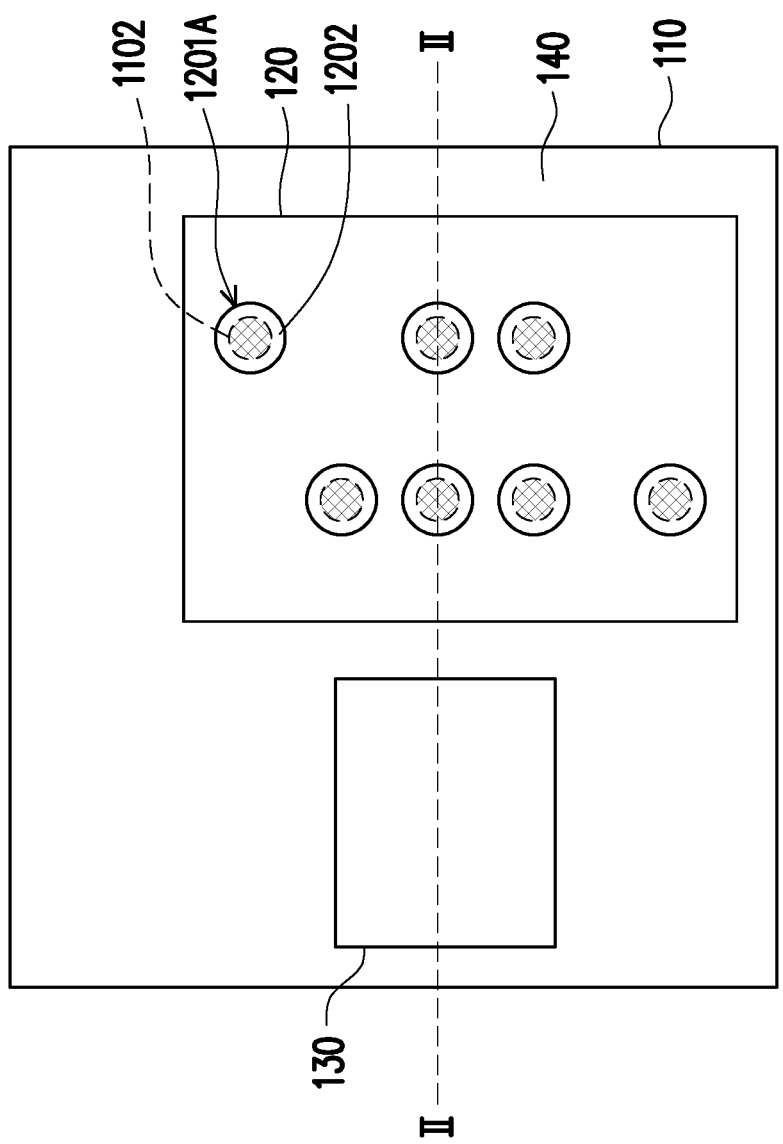
FIG. 1 schematically illustrates a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 schematically illustrates a semiconductor package in accordance with some embodiments of the disclosure. A semiconductor package 100 includes a first die 110, a second die 120 and a third die 130. The first die 110 may have a larger size in the top view than the second die 120 and the third die 130, and the second die 120 and the third die 130 are both stacked on the first die 110. The semiconductor package 100 further includes a transparent encapsulating material 140 disposed on the first die 110 and laterally encapsulating the second die 120 and the third die 130. In the top view, the area of the first die 110 may be substantially equal to a total area of the second die 120, the third die 130 and the transparent encapsulating material 140. The area of the second die 120 and the area of the third die 130 may not overlap in the top view. In some embodiments, the area of the second die 120 may be greater than the area of the third die 130, but is not limited thereto.

The first die 110 is a photonic integrated circuit die which includes optical components, active components (e.g., transistors or the like) and passive components (e.g., resistors, capacitors, inductors, or the like) formed therein and is capable of converting an optical signal into an electric signal. The third die 130 is an electric die including active components (e.g., transistors or the like) and passive components (e.g., resistors, capacitors, inductors, or the like) formed therein, and the third die 130 is electrically connected to the first die 110, such that the third die 130 may process the electric signal converted from the optical signal in the first die 110. The second die 120 may not include circuit elements/components therein and thus there may be no electric connection between the second die 120 and the first die 110 as well as the second die 120 and the third die 130. The second die 120 allows optical signals to pass through so as to serve as a conductor for optical signals.

Figure 2:
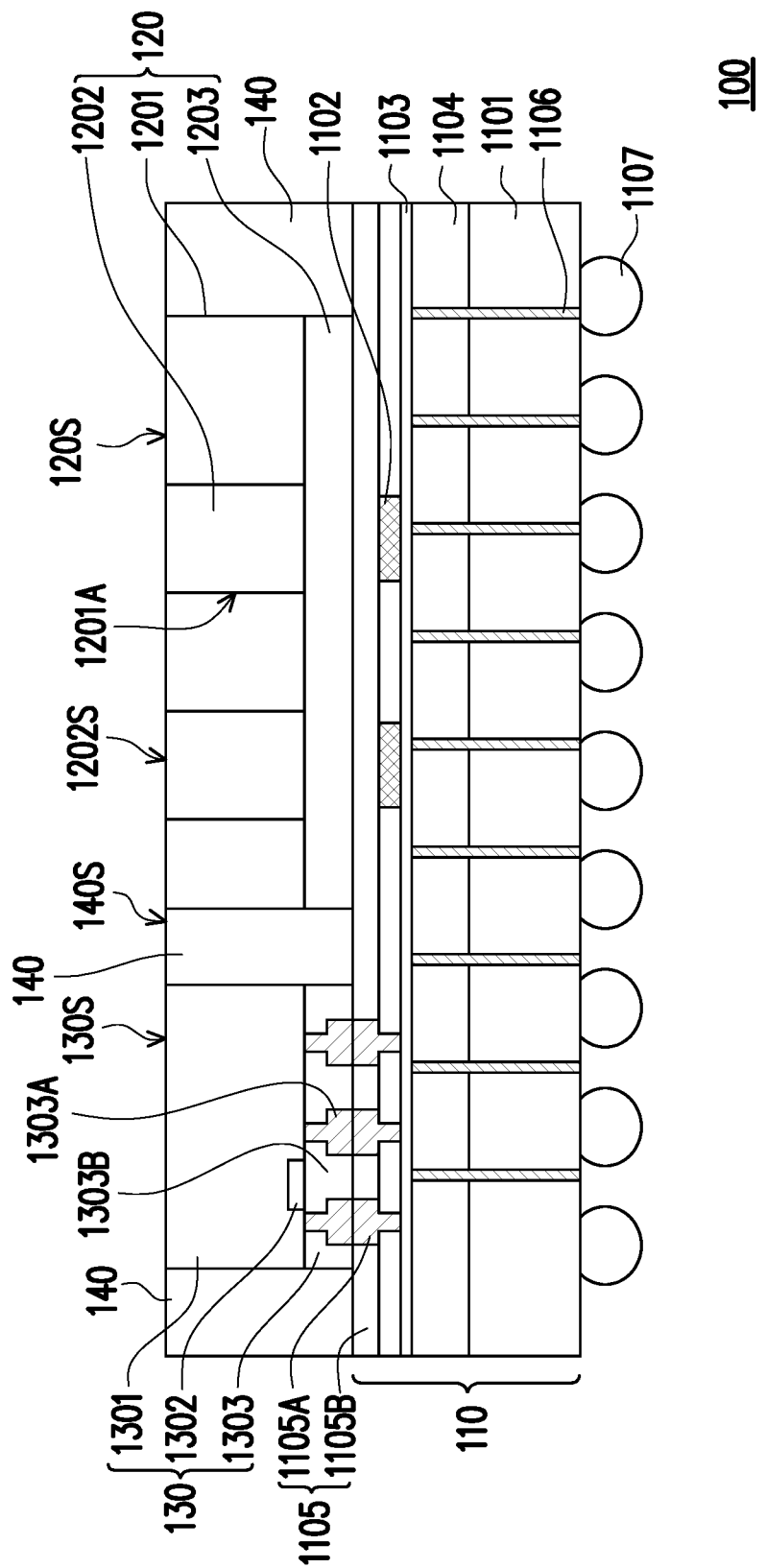
FIG. 2 schematically illustrates a cross section of the semiconductor package taken along line II-II of FIG. 1 in accordance with some embodiments of the disclosure.

FIG. 2 schematically illustrates a cross section of the semiconductor package taken along line II-II of FIG. 1 in accordance with some embodiments of the disclosure. In FIG. 1 and FIG. 2, the first die 110 may include a substrate 1101, an optical coupler 1102, a wave guide layer 1103, an isolation layer 1104, a metallization structure 1105, a through via 1106 and a connector 1107, for example. The substrate 1101 may be a semiconductor substrate, which may be a silicon substrate, a silicon germanium substrate, or a substrate formed of other semiconductor materials. In some alternative embodiments, the substrate 1101 may be a dielectric substrate formed of, for example, silicon oxide. In some embodiments, one or more active components (e.g., transistors or the like) and/or passive components (e.g., resistors, capacitors, inductors, or the like) may be formed on the substrate 1101 through front end of line (FEOL) fabrication processes of the semiconductor wafer. The active components and/or passive components may be formed at the front side of the substrate 1101 that faces to the third die 130 and may convert optical signals to electric signals.

The optical coupler 1102 is disposed on the substrate 1101 and has grating, so that the optical coupler 1102 may have the function of receiving light or transmitting light. As shown in top view of FIG. 1, a quantity of the optical coupler 1102 may be a plural and the optical couplers 1102 may be separated from each other to define a plurality of light receiving spots, but the disclosure is not limited thereto. The optical coupler 1102 may be made of silicon, silicon nitride, silicon oxynitride, polysilicon, or a combination of these materials. In some embodiments, the grating of the optical coupler 1102 may be designed based on the required bandwidth. The wave guide layer 1103 is disposed on the substrate 1101. In some embodiments, the wave guide layer 1103 may be formed by a silicon layer that is patterned to form the waveguides for the internal transmission of optical signals. The optical coupler 1102 may be formed on the wave guide layer 1103 and forms an optical communication with the wave guide layer 1103.

The isolation layer 1104 is disposed on the substrate 1101 and between the substrate 1101 and the waveguide layer 1103. The isolation layer 1104 may be formed of a dielectric material such as silicon oxide, silicon nitride, or the like. The isolation layer 1104 spaces the wave guide layer 1103 from the substrate 1101 by a distance, which prevents an optical interference between the wave guide layer 1103 and the substrate 1101. In other words, the optical signals transmitted in the waveguide layer 1103 may not have an influence on the substrate 1101 and/or the components formed on the substrate 1101.

The metallization structure 1105 is formed on the substrate 1101 and above the optical coupler 1102. The metallization structure 1105 may include interconnect wirings (e.g., copper interconnect wirings) and dielectric layer stacked alternately, wherein the interconnect wirings of the metallization structure 1105 are electrically connected to the active components and/or the passive components formed on the substrate 1101. The metallization structure 1105 may be formed through back end of line (BEOL) fabrication processes of the semiconductor wafer. The outermost interconnect wirings in the metallization structure 1105 may include conductive pads 1105A, and the conductive pads 1105A may be aluminum pads, copper pads, or other suitable metallic pads.

The first die 110 may also serve as an interposer that has through via 1106 forming an electric connection from the front side of the first die 110 facing the third die 130 to the opposite, back side of the first die 110 further away from the third die 130. The through via 1106 penetrates through the substrate 1101 and may be formed of a conductive material, which may also be a metallic material such as tungsten, copper, titanium, or the like. In addition, the connector 1107 is disposed at the back side of the first die 110 and electrically connected to the through via 1106. The connecter 1107 is used for connecting to an external component such as a package substrate, a printed circuit board, or the like. In some embodiments, the connector 1107 may a solder ball, a metal pillar, a controlled collapse chip connection (C4) bump, a micro bump, an electroless nickel-electroless palladium-immersion gold technique (ENEPIG) formed bump, combination thereof (e.g., a metal pillar having a solder ball attached thereof), or the like. The connector 1107 may include a conductive material such as solder, copper, aluminum, gold, nickel, silver, palladium, tin, the like, or a combination thereof. In some embodiments, the connector 1107 includes a eutectic material and may include a solder bump or a solder ball, as examples. In some embodiments, the connector 1107 includes metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

The second die 120 may include a substrate 1201, a transparent portion 1202 and an adhesive 1203. The substrate 1201 may be a semiconductor substrate, which may be a silicon substrate, a silicon germanium substrate, or a substrate formed of other semiconductor materials. In some alternative embodiments, the substrate 110 may be a dielectric substrate formed of, for example, silicon oxide. The substrate 1201 has a through hole 1201A that extends through the whole thickness of the substrate 1201.

A transparent material fills the through hole 1201A to form the transparent portion 1202. In other words, the transparent portion 1202 may have a different material from the substrate 1201 and is transparent to optical signals that are predetermined to be received by the optical coupler 1102 of the first die 110. In some embodiments, the material of the transparent portion 1202 may include an oxide such as silicon oxide, titanium oxide, aluminum oxide, tantalum oxide, hafnium oxide, zirconium oxide, tin oxide or the like. The material of the transparent portion 1202 may include silicon nitride, silicon oxynitride or the like.

The adhesive 1203 is formed at a side of the substrate 1201 adjacent to the first die 110. The adhesive 1203 is in contact with the metallization structure 1105 so that the second die 120 is attached to the first die 110 through the adhesive 1203. The material of the adhesive 1203 may include oxy resin, phenol resin, acrylic rubber, silica filler, or a combination thereof. In some embodiments, the second die 120 is formed by the substrate bulk, the substrate 1201, with the transparent portion 1202 therein. The second die 120 may not include a circuit components such as active components or passive components. Therefore, no electrical connection is formed between the first die 110 and the second die 120 or between another component and the second die 120.

The transparent portion 1202 of the second die 120 overlaps the optical coupler 1102. In some embodiments, a projection of the optical coupler 1102 on the substrate 1101 of the first die 110 is located within a projection of the transparent portion 1202 on the substrate 1101 of the first die 110. For example, in the top view as shown in FIG. 1, the area of the optical coupler 1102 is completely surrounded by the area of the transparent portion 1202. In addition, the adhesive 1203 and the metallization structure 1105 may be transparent at the portions that overlap with the transparent portion 1202 so as not to obstruct the optical communication between the transparent portion 1202 and the optical coupler 1102. Accordingly, the transparent portion 1202 is optically communicated with the optical coupler 1102. In some embodiments, the wirings or metal components in the metallization structure 1105 may bypass an area underlying the transparent portion 1202 and the area underlying the transparent portion 1202 may be filled by a material of the dielectric layer structure in the metallization structure 1105, such as silicon oxide, silicon nitride, silicon oxynitride, or the like. In addition, the material of the adhesive 1203 may be transparent.

The third die 130 includes a substrate 1301, a circuit component 1302 and a metallization structure 1303. The substrate 1301 may be a semiconductor substrate, which may be a silicon substrate, a silicon germanium substrate, or a substrate formed of other semiconductor materials. In some alternative embodiments, the substrate 1301 may be a dielectric substrate formed of, for example, silicon oxide. The circuit component 1302 may include one or more active components (e.g., transistors or the like) and/or passive components (e.g., resistors, capacitors, inductors, or the like) formed on the substrate 1301 through front end of line (FEOL) fabrication processes of the semiconductor wafer and construct logic circuits, memory or a combination thereof. The circuit component 1302 may be formed at the front side of the substrate 1301 that faces to the first die 110.

The metallization structure 1303 is formed on the substrate 1301. The metallization structure 1303 may include interconnect wirings (e.g., copper interconnect wirings) and dielectric layer stacked alternately, wherein the interconnect wirings of the metallization structure 1105 are electrically connected to the active components and/or the passive components in the substrate 1301. The metallization structure 1303 may be formed through back end of line (BEOL) fabrication processes of the semiconductor wafer. The outermost interconnect wirings in the metallization structure 1303 may include conductive pads 1303A, and the conductive pads 1303A may be aluminum pads, copper pads, or other suitable metallic pads.

The third die 130 is bonded to the first die 110 through a hybrid bonding process. The metallization structure 1105 of the first die 110 is in contact with the metallization structure 1303 of the third die 130 without a gap therebetween. The conductive pads 1303A and the conductive pads 1105A may be in contact with one another so that the third die 130 is electrically connected to the first die 110. In addition, the dielectric layer structure 1303B surrounding the conductive pads 1303A is also in contact with the dielectric layer structure 1105B surrounding the conductive pads 1105A. In some embodiments, a size of the conductive pads 1303A and the conductive pads 1105A may be several micrometers such as 2.5 micrometers which is much smaller than a micro bump that is additionally formed for bonding the third die 130 to the first die 110. Accordingly, by using hybrid bonding technique, the bonding density, the transmission speed and the bandwidth density may be improved and energy consumption is reduced.

The transparent encapsulating material 140 is formed on the first die 110 to surround the second die 120 and the third die 130. The transparent encapsulating material 140 laterally encapsulates the second die 120 and the third die 130. The top surface 120S of the second die 120 as well as the top surface 1202S of the transparent portion 1202 and the top surface 130S of the third die 130 are not covered by the transparent encapsulating material 140. In some embodiments, a top surface 120S of the second die 120, a top surface 1202S of the transparent portion 1202, a top surface 130S of the third die 130, and a top surface 140S of the transparent encapsulating material 140 are coplanar with one another. An optical fiber (not shown) that is used for transmitting an optical signal to the semiconductor package 100 may attach to the top surface 1202S of the transparent portion 1202, such that the optical signal transmitted by the optical fiber is allowed to be received by the optical coupler 1102. In some embodiments, the material of the transparent portion 1202 is transparent to the optical signal transmitted by the optical fiber.

The transparent portion 1202 and the transparent encapsulating material 140 are both transparent. In some embodiments, the transparent portion 1202 and the transparent encapsulating material 140 are of the same material such as silicon oxide. In some embodiments, the transparent material, such as silicon oxide, of the transparent portion 1202 and the transparent encapsulating material 140 may have a different thermal expansion coefficient from the material, such as silicon, of the substrate 1301 of the third die 130 and the material, such as silicon, of the substrate 1201 of the second die 120. In the top view, the total area of the transparent portion 1202 and the transparent encapsulating material 140 may occupy less than 35% of the whole area of the first die 110. Accordingly, unwanted warpage caused by the difference in the thermal expansion coefficient may be prevented, which facilitates to ensure the quality and performance of the semiconductor package 100.

Figure 3:
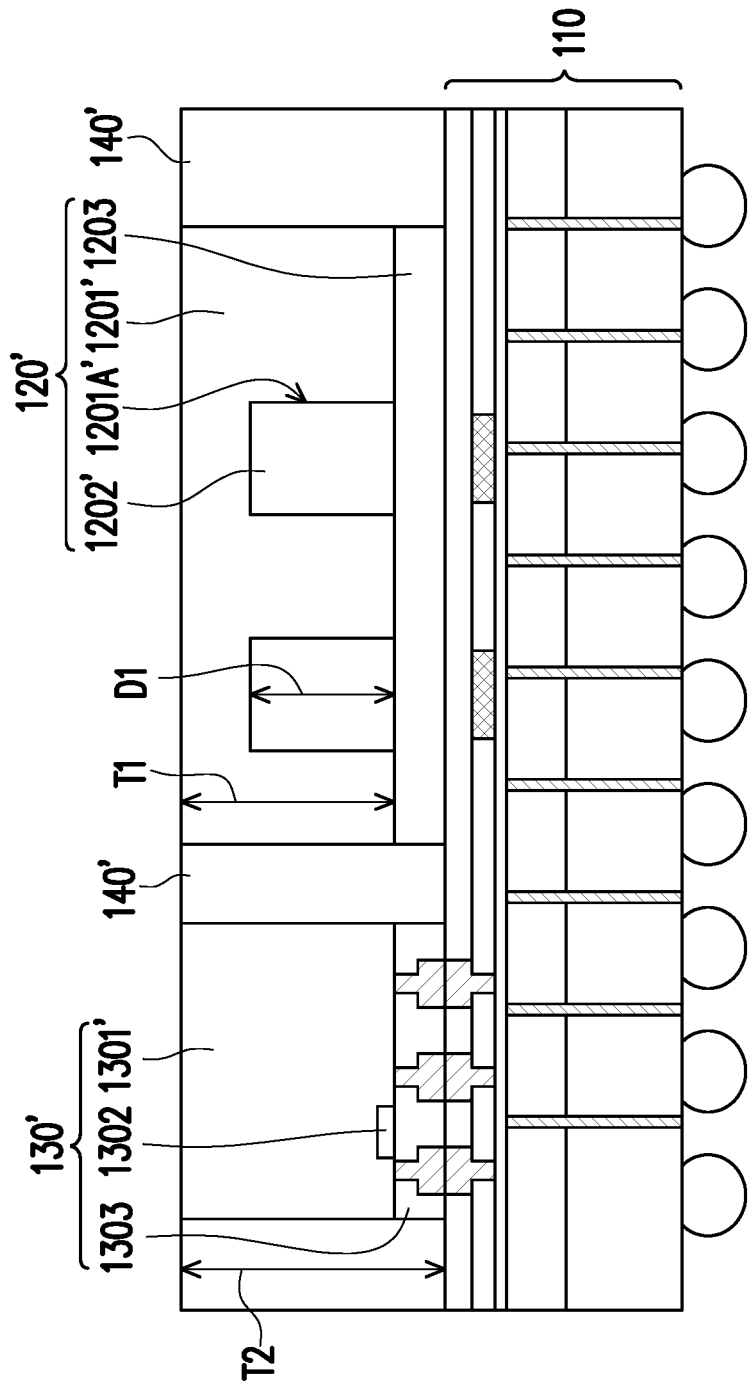
FIG. 3 schematically illustrates a structure of a semiconductor package that is semi-fabricated in accordance with some embodiments of the disclosure.

FIG. 3 schematically illustrates a structure of a semiconductor package that is semi-fabricated in accordance with some embodiments of the disclosure. In FIG. 3, a first die 110 that is similar to the first die 110 shown in FIG. 2 is provided. A second die 120' and a third die 130' are attached to the first die 110. The second die 120' is attached to the first die 110 using an adhesion technique and no gap is formed between the second die 120' and the first die 110. The third die 130' is attached to the first die 110 using a hybrid bonding technique so that no gap is formed between the first die 110 and the third die 130'. In addition, a transparent encapsulating material 140' is formed on the first die 110 to at least laterally encapsulate the second die 120' and the third die 130'. In some embodiments, the transparent encapsulating material 140' may be formed by using a deposition process such as CVD process. The transparent encapsulating material 140' may laterally surround the second die 120' and the third die 130' without interposed between the second die 120' and the first die 110 and between the third die 130' and the first die 110.

The second die 120' includes a substrate 1201' having an opening 1201A', a transparent portion 1202' filling the opening 1201A' and an adhesive 1203. The opening 1201A' of the substrate 1201' extends from a side of the substrate 1201' into a certain depth along the thickness direction of the substrate 1201'. The thickness T1 of the substrate 1201' is greater than the depth D1 of the opening 1201A' and thus the opening 1201A' does not pass through the substrate 1201'.

The second die 120' is oriented that the opening 1201A' faces to the first die 110 and attached onto the first die 110 through the adhesive 1203.

The third die 130' includes a substrate 1301', a circuit component 1302 formed on the substrate 1301' and a metallization structure 1303. The circuit component 1302 and the metallization structure 1303 may be similar to those described in FIG. 2. The third die 130' is bonded to the first die 110 through the metallization structure 1303, for example using a hybrid bonding process. The third die 130' is oriented that the circuit component 1302 faces to the first die 110.

The transparent encapsulating material 140' at least fills the gap between the second die 120' and the third die 130' and encircles the second die 120' and the third die 130'. In some embodiments, the thickness T2 of the transparent encapsulating material 140' may be greater than the height of the second die 120' and the height of the third die 130' so that tops of the second die 120' and the third die 130' may be covered by the transparent encapsulating material 140'. The structure shown in FIG. 3 may be thinned using a grinding process or similar process until the transparent portion 1202' in the substrate 1201' is exposed to form the semiconductor package 100 shown in FIG. 2. In other words, the second die 120, the third die 130 and the transparent encapsulating material 140 may be formed by thinning the second die 120', the third die 130' and the transparent encapsulating material 140' of FIG. 3. After the thinning, as shown in FIG. 2, the opening 1201A penetrates through the thickness of the substrate 1201 and a top surface 1202S of the transparent portion 1202 in the opening 1201A is leveled with the substrate 1201, the third die 130 and the transparent encapsulating material 140.

Figure 4:
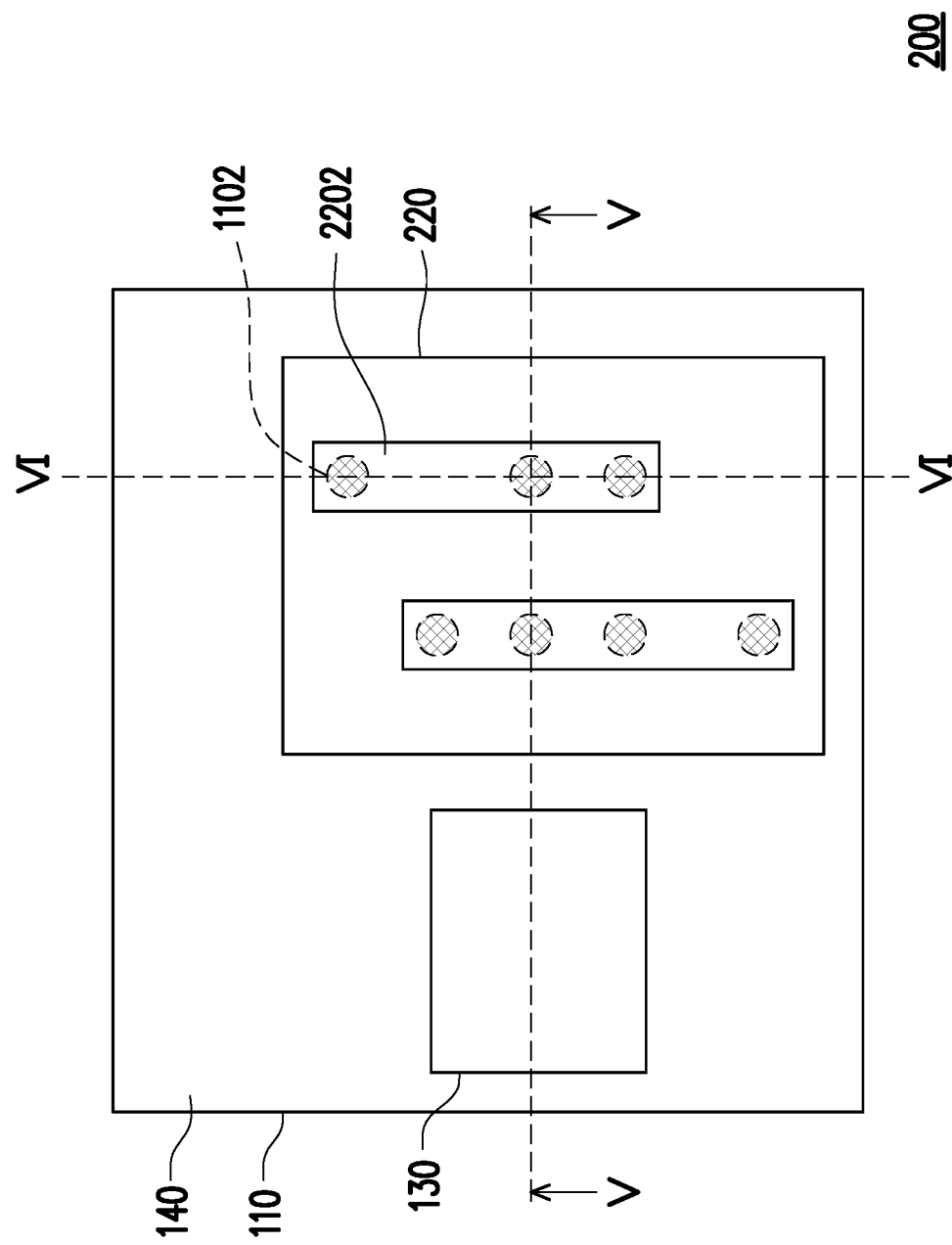
FIG. 4 schematically illustrates a semiconductor package in accordance with some embodiments of the disclosure.

FIG. 4 schematically illustrates a semiconductor package in accordance with some embodiments of the disclosure. A semiconductor package 200 may include a first die 110, a second die 220 and a third die 130. The first die 110 may have a larger size in the top view than the second die 220 and the third die 130. The second die 220 and the third die 130 are both stacked on the first die 110. The semiconductor package 200 may further include a transparent encapsulating material 140 disposed on the first die 110 and laterally encapsulating the second die 220 and the third die 130. In the top view, the area of the first die 110 may be substantially equal to a total area of the second die 220, the third die 130 and the transparent encapsulating material 140. The area of the second die 220 and the area of the third die 130 may not overlap in the top view. Similar to the semiconductor package 100, the first die 110 is a photonic integrated circuit die, the second die 220 does not include a circuit component to be electrically connected to another die and the third die 130 is an electric die that is electrically connected to the first die 110.

In FIG. 4, the first die 110 includes a plurality of optical couplers 1102 arranged in the area of the second die 220. The second die 220 includes a transparent portion 2202 that has an elongated shape in the top view. For example, FIG. 4 shows two stripe-shaped transparent portions 2202 for illustration purpose. The transparent portions 2202 are arranged corresponding to the locations of the optical couplers 1102. For example, each transparent portion 2202 overlaps multiple optical couplers 1102 arranged in a row in the top view. In other words, an area of one single transparent portion 2202 covers multiple optical couplers 1102. In the top view, the total area of the transparent portion 2202 and the transparent encapsulating material 140 may occupy less than 35% of the whole area of the first die 110. In addition, the shape of the transparent portion 2202 may be designed based on various requirements and not limited to the stipe-shape shown in FIG. 4.

Figure 5:
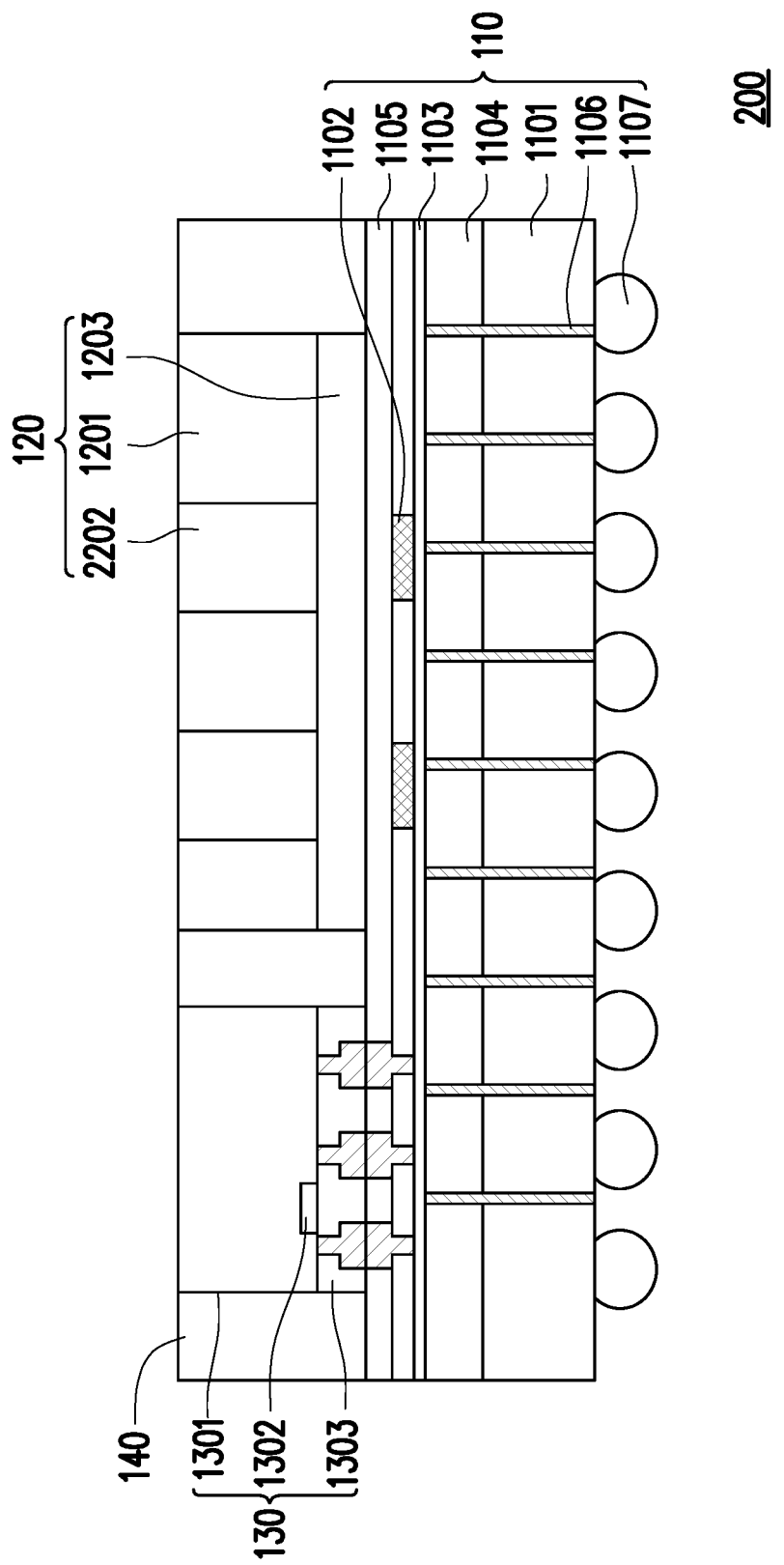
FIG. 5 schematically illustrates a cross section of the semiconductor package taken along line V-V in FIG. 4 in accordance with some embodiments of the disclosure.
Figure 6:
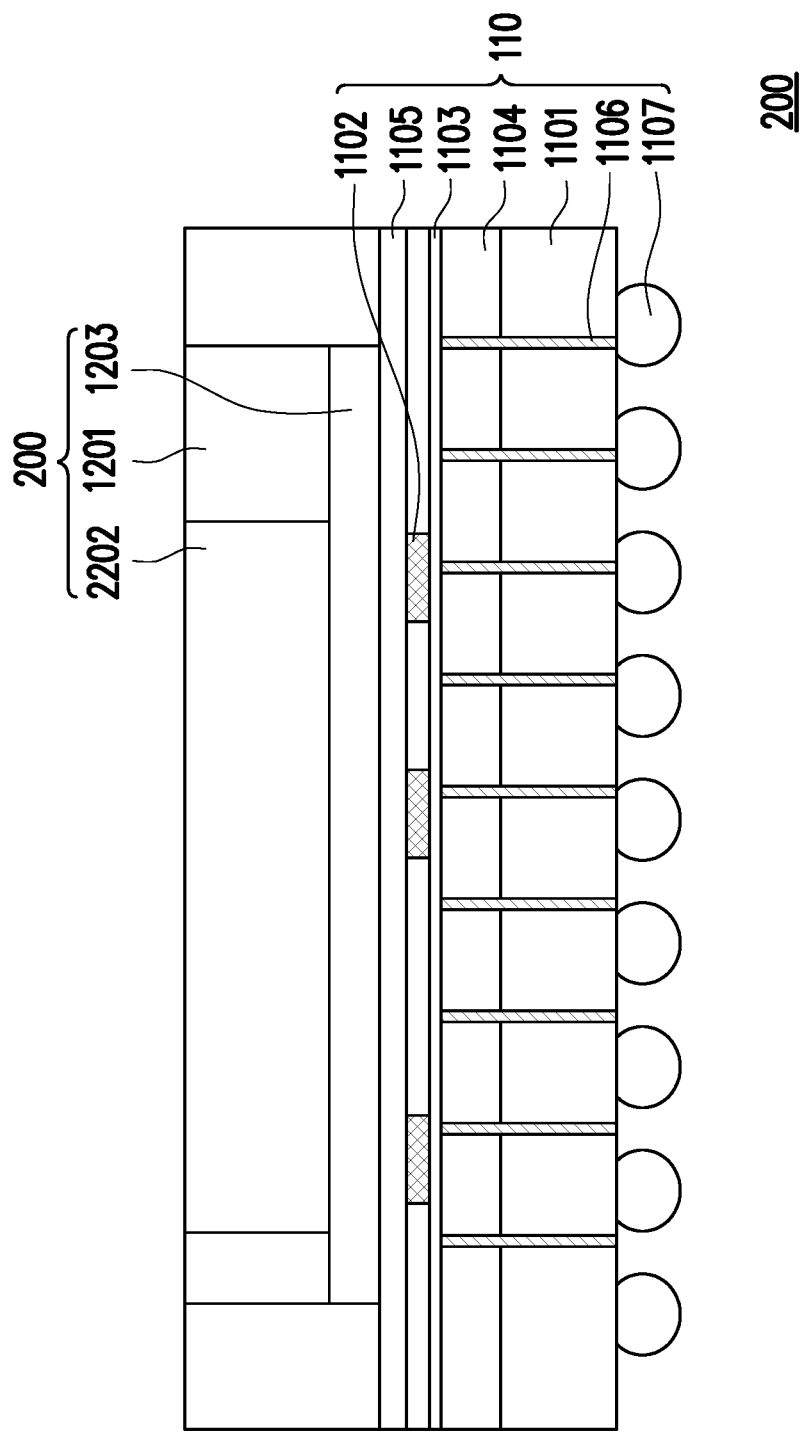
FIG. 6 schematically illustrates a cross section of the semiconductor package taken along line VI-VI in FIG. 4 in accordance with some embodiments of the disclosure.

FIG. 5 and FIG. 6 schematically illustrate cross sections of the semiconductor package respectively taken along lines V-V and VI-VI in FIG. 4 in accordance with some embodiments of the disclosure. The first die 110 includes a substrate 1101, an optical coupler 1102, a wave guide layer 1103, an isolation layer 1104, a metallization structure 1105, a through via 1106 and a connector 1104. The second die 220 includes a substrate 1201, a transparent portion 2202 and an adhesive 1203. The third die 130 includes a substrate 1301, a circuit component 1302 and a metallization structure 1303. Some of the components in FIG. 5 and FIG. 6 are indicated by the reference numbers substantially the same as those described in FIG. 2 and details of such components described in the above embodiment may be applicable and incorporated to the present embodiment.

One or more optical fibers (not shown) may be attached to the semiconductor package 200 and specifically, attached to the transparent portions 2202 formed in the second die 220. A terminal of each of the optical fibers may be arranged aligned to one of the optical couplers 1102. The material of the transparent portion 2202 is transparent to the optical signals transmitted by the optical fibers. Namely, the optical signals transmitted in the optical fiber are able to pass through the transparent portion 2202 and is received by the corresponding optical couplers 1102. The optical signals received by the optical coupler 1102 is further guided by the wave guide layer 1103 and converted into electric signals by the circuit components in the first die 110. The electric signals converted from the optical signals is then transmitted from the first die 110 to the third die 130 and processed by the circuit component 1302 in the third die 130. Thereafter, the processed results may be transmitted by the through via 1106 in the first die 110 and output from the semiconductor package 200 via the connector 1107 disposed at the back side of the first die 110.

In FIG. 6, the transparent portion 2202 in the second die 220 covers multiple optical couplers 1102 without being divided and/or separated. In some embodiments, the material of the transparent portion 2202 may be the same as the material of the transparent encapsulating material 140. The second die 220 may be fabricated by using the process described in FIG. 3. In other words, the second die 220 may be formed by thinning a thicker die in which the transparent portion 2202 is not exposed at the side away from the first die 110.

Figure 7:
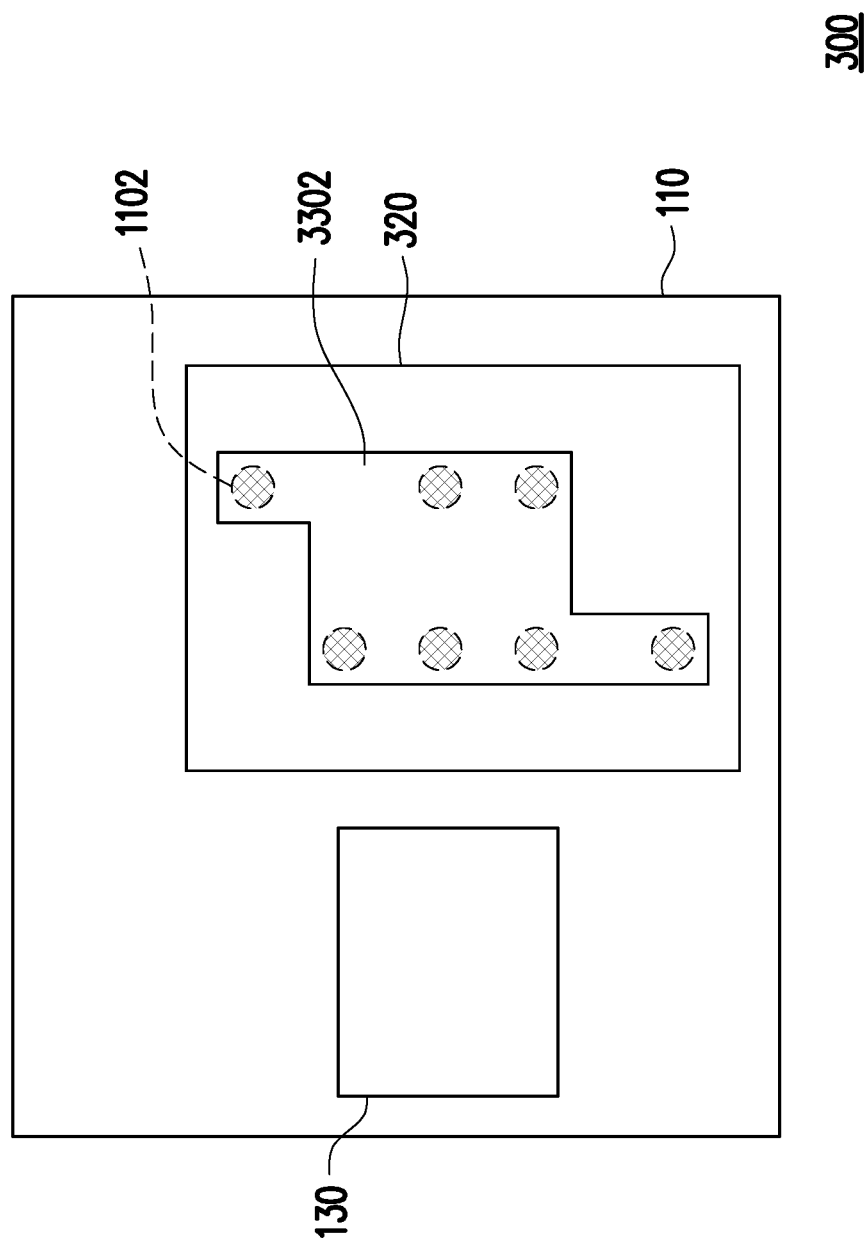
FIG. 7 schematically illustrates a semiconductor package in accordance with some embodiments of the disclosure.

FIG. 7 schematically illustrates a semiconductor package in accordance with some embodiments of the disclosure. In FIG. 7, a semiconductor package 300 may include a first die 110, a second die 320 and a third die 130. The first die 110 includes a plurality of optical couplers 1102 arranged in the area of the second die 220. The second die 320 includes one single transparent portion 3202 that has an N-like shape in the top view. The transparent portion 3202 is designed based on the locations of the optical couplers 1102. In FIG. 7, one single transparent portion 2202 overlaps all optical couplers 1102 formed in the first die 110. In the top view, the total area of the transparent portion 3202 and the transparent encapsulating material 140 may occupy less than 35% of the whole area of the first die 110. In addition, the shape of the transparent portion 3202 is not limited and may be designed based on various requirements.

Figure 8:
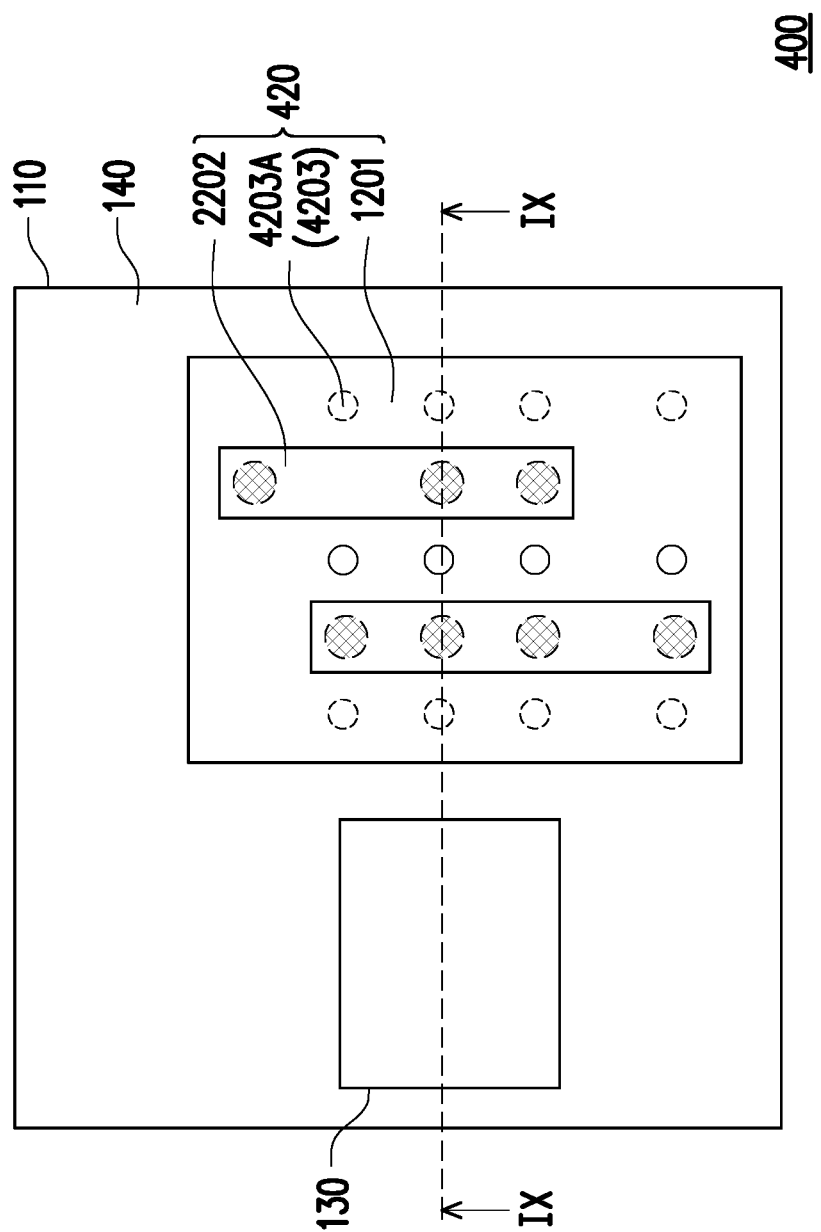
FIG. 8 schematically illustrates a semiconductor package in accordance with some embodiments of the disclosure.

FIG. 8 schematically illustrates a semiconductor package in accordance with some embodiments of the disclosure. A semiconductor package 400 may include a first die 110, a second die 420, a third die 130 and a transparent encapsulating material 140. The first die 110 may have a larger size in the top view than the second die 420 and the third die 130, and the second die 420 and the third die 130 are both stacked on the first die 110. The transparent encapsulating material 140 on the first die 110 laterally encapsulates the second die 420 and the third die 130. In the top view, the area of the first die 110 may be substantially equal to a total area of the second die 420, the third die 130 and the transparent encapsulating material 140. The area of the second die 420 and the area of the third die 130 may not overlap in the top view. Similar to the semiconductor package 100, the first die 110 is a photonic integrated circuit die, the second die 220 does not include a circuit component to be electrically connected to another die, and the third die 130 is an electric die that is electrically connected to the first die 110.

In some embodiments, the first die 110 is a photonic integrated circuit die which includes optical components, active components (e.g., transistors or the like) and passive components (e.g., resistors, capacitors, inductors, or the like) formed therein and is capable of converting an optical signal into an electric signal. The third die 130 is an electric die including active components (e.g., transistors or the like) and passive components (e.g., resistors, capacitors, inductors, or the like) formed therein, and the third die 130 is electrically connected to the first die 110, such that the third die 130 may process the electric signal converted from the optical signal in the first die 110. The second die 420 allows optical signals to pass through so as to serve as a connector for optical signal such as a light transmitted by an optical fiber attached to the semiconductor package 400. No electric connection between the second die 420 and the first die 110 as well as the second die 420 and the third die 130 is formed.

Figure 9:
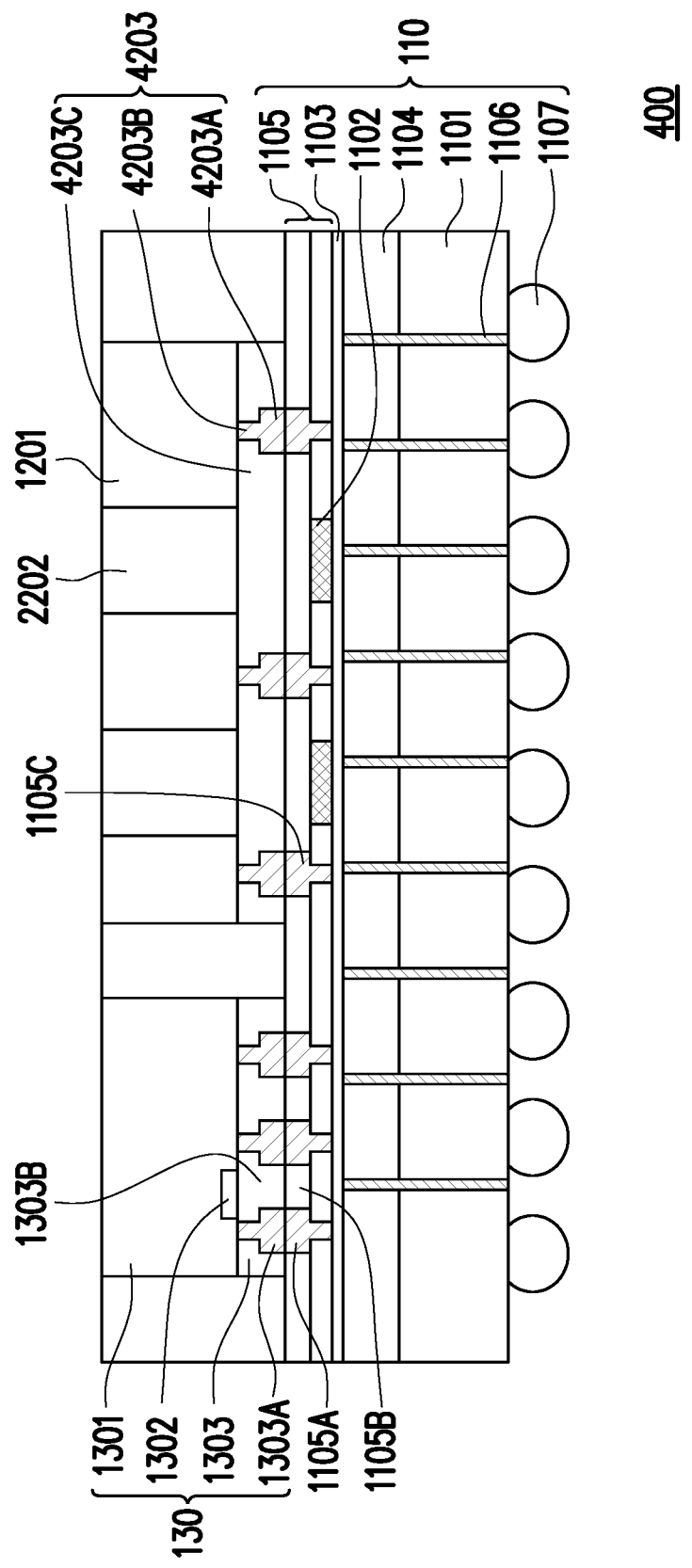
FIG. 9 schematically illustrates a cross section of the semiconductor package taken along line IX-IX of FIG. 8 in accordance with some embodiments of the disclosure.

FIG. 9 schematically illustrates a cross section of the semiconductor package taken along line IX-IX of FIG. 8 in accordance with some embodiments of the disclosure. In FIG. 8 and FIG. 9, the first die 110 includes a substrate 1101, an optical coupler 1102, a wave guide layer 1103, an isolation layer 1104, a metallization structure 1105, a through via 1106 and a connector 1107, for example. The second die 420 includes a substrate 1201, a transparent portion 2202 and a metallization structure 4203. The third die 130 includes a substrate 1301, a circuit component 1302 and a metallization structure 1303. Some of the components in FIG. 8 and FIG. 9 are indicated by the reference numbers substantially the same as those described in FIG. 2 and FIGS. 5-6 and details of such components described in the above embodiments may be applicable and incorporated to the present embodiment.

The second die 420 is attached to the first die 110 through the metallization structure 4203. For example, the metallization structure 4203 is formed on the substrate 1201 and includes conductive pads 4203A, conductive vias 4203B and dielectric layer structure 4203C. The conductive pads 4203A are the outermost conductive pattern in the metallization structure 4203, the dielectric layer structure 4203C surrounds the conductive pads 4203A and the vias 4203B pass through at least one dielectric layer of the dielectric layer structure 4203C.

Figure 10:
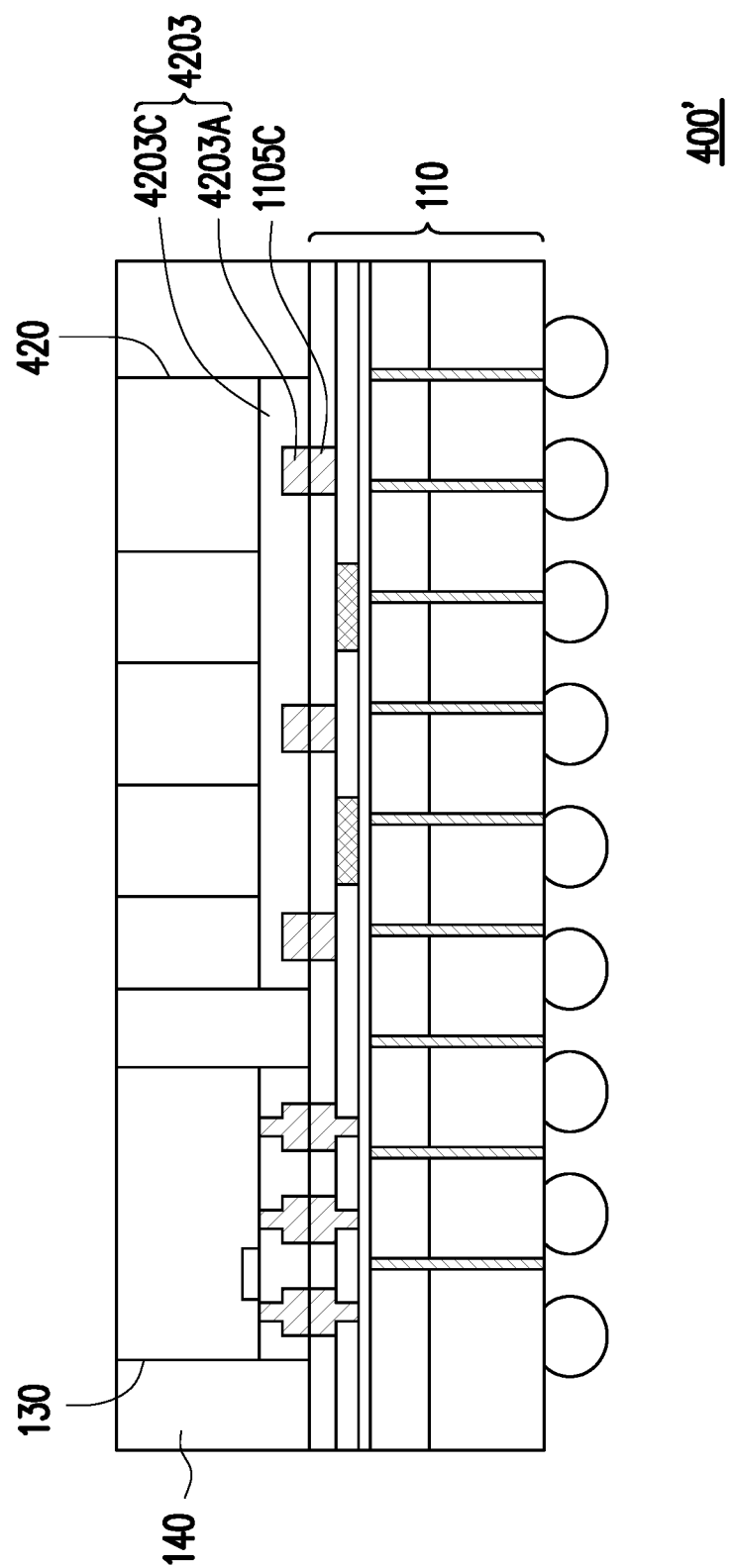
FIG. 10 schematically illustrates a cross section of the semiconductor package in accordance with some embodiments of the disclosure.

The metallization structure 1105 of the first die 1105 includes conductive pads 1150A, a dielectric layer structure 1105B and conductive pads 1105C. The conductive pads 1105A are formed underlying the third die 130, the conductive pads 1105C are formed underlying the second die 420 and the dielectric layer structure 1105B is formed surrounding the conductive pads 1105A and the conductive pads 1105C. Specifically, the second die 420 is bonded to the first die 110 through a hybrid bonding process, similar to the way the third die 130 being bonded to the first die 110. The conductive pads 1105C are in contact with the conductive pads 4203A of the second die 420. In addition, the dielectric layer structure 1105B in the metallization structure 1105 is in contact with the dielectric layer structure 4203C in the metallization structure 4203. The second die 420 does not include a circuit component and no electrical connection is required. Therefore, the conductive pads 4203A and the vias 4203B may be electrically floating. The conductive pads 1105C formed overlapping the second die 420 may also be electrically floating. In some embodiments, the vias such as the via 4203B formed in the metallization structure 4203 may be omitted as shown in a semiconductor package 400' of FIG. 10. Specifically, the semiconductor package 400' includes a first die 110, a second die 420, a third die 130 and a transparent encapsulating material 140. Details of the first die 110, the second die 420, the third die 130 and the transparent encapsulating material 140 may refer to the above descriptions without reiterated here. In FIG. 10, the metallization structure 4203 may include conductive pads 4203A and dielectric layer structure 4203C without a via. The conductive pads 4203 is in contact with the conductive pads 1105C through a hybrid bonding process and are electrically floating without electrically connected to another component.

In some embodiments of the semiconductor package, a die without a circuit component is attached to a photonic die and allows optical signals to pass through. An electric die is also attached to the photonic die using a hybrid bonding. The die without a circuit component may have a similar physical property such as thermal expansion coefficient to the electric die and thus a warpage issue due to the difference on the thermal expansion coefficient is mitigated. The electric die bonded to the photonic die through the hybrid bonding process may improve the bonding density, the transmission speed and the bandwidth density of the semiconductor package and further reduce the required energy consumption.

In accordance with some embodiments of the disclosure, a semiconductor package including a first die, a second die and a transparent encapsulation material is provided. The first die includes a first substrate and an optical coupler formed on the first substrate. The second die is disposed on the first die and includes a transparent portion overlapping the optical coupler. The transparent encapsulation material is disposed on the first die and laterally encapsulates the second die. A material of the transparent portion is the same as a material of the transparent encapsulation material. A top surface of the transparent portion is coplanar with a top surface of the transparent encapsulation material. The second die further includes a second substrate and the transparent portion penetrates through the second substrate from a side adjacent to the first die to an opposite side. The first die further includes a wave guide layer disposed on the first substrate and the optical coupler is disposed on the wave guide layer. A third die is further disposed on and electrically connected to the first die. The transparent encapsulating material laterally encapsulates the third die. The third die is connected to the first die through a hybrid bonding technique. The second die further includes an adhesive, and the second die is connected to the first die through the adhesive.

In accordance with some other embodiments of the disclosure, a semiconductor package including a first die, a second die and a third die is provided. The first die includes an optical coupler, a first conductive pad, and a second conductive pad. The second die is disposed on the first die and includes a transparent portion and a third conductive pad, wherein the third conductive pad is electric floating and in contact with the first conductive pad, and the transparent portion overlaps the optical coupler. The third die is disposed on the first die and includes a fourth conductive pad in contact with the second conductive pad. The second die further includes a substrate, and the transparent portion is disposed in the substrate and penetrates through the substrate. A material of the transparent portion includes an oxide. The first die further includes a first dielectric layer structure surrounding the first conductive pad and the second conductive pad. The second die further includes a second dielectric layer structure surrounding the third conductive pad. The third die further includes a third dielectric layer structure surrounding the fourth conductive pad, and the second dielectric layer structure and the third dielectric layer structure are in contact with the first dielectric layer structure. A transparent encapsulating material is further disposed on the first die and laterally surrounds the second die and the third die.

In accordance with some other embodiments of the disclosure, a semiconductor package including a first die, a second die and a transparent encapsulating material is provided. The second die is disposed on the first die and includes a transparent portion. The transparent encapsulation material is disposed on the first die and laterally encapsulating the second die, wherein a material of the transparent portion is the same as a material of the transparent encapsulation material. The transparent encapsulating material and the transparent portion occupy less than 35% of a total area of the first die in a top view. A material of the transparent portion includes an oxide. A top surface of the transparent portion is coplanar with a top surface of the transparent encapsulation material. The first die includes a substrate, an optical coupler and a wave guide layer, the wave guide layer is disposed on the first substrate and the optical coupler is disposed on the wave guide layer. The transparent portion overlaps the optical coupler.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first die comprising an optical coupler;
a second die disposed on the first die, the second die comprising a substrate and a transparent portion disposed within the substrate and optically coupled to the optical coupler; and
a transparent encapsulation material disposed on the first die and extending along sidewalls of the substrate of the second die.

2. The semiconductor package of claim 1, wherein the second die further comprises a metallization structure disposed on a front side of the substrate and bonded to the first die.

3. The semiconductor package of claim 2, wherein the metallization structure of the second die comprises a dielectric layer and a conductive feature covered by the dielectric layer, and the conductive feature comprises an end facing the substrate and an opposing end bonded to the first die.

4. The semiconductor package of claim 1, wherein the first die further comprises a substrate over which the optical coupler is disposed and a waveguide disposed between the optical coupler and the substrate of the first die.

5. The semiconductor package of claim 1, wherein the transparent portion of the second die is directly over the optical coupler of the first die.

6. The semiconductor package of claim 1, wherein the optical coupler comprises a plurality of first discrete portions, the transparent portion comprises a plurality of second discrete portions, and each of the second discrete portions overlaps one of the first discrete portions.

7. The semiconductor package of claim 6, wherein in a top view, a vertical projection of the optical coupler of the first die is located within a vertical projection of the transparent portion of the second die.

8. The semiconductor package of claim 1, wherein a backside of the substrate of the second die is substantially leveled with a surface of the transparent portion of the second die.

9. The semiconductor package of claim 1, wherein a first surface of the transparent portion of the second die is substantially leveled with a front side of the substrate, and a second surface of the transparent portion opposite to the first surface is between the front side and a backside of the substrate.

10. The semiconductor package of claim 1, wherein the optical coupler comprises discrete portions, and the discrete portions are located within the transparent portion in a top view.

11. A semiconductor package, comprising:
a first die comprising an optical coupler;
a second die bonded to the first die, the second die comprising a substrate and a transparent portion embedded in the substrate, wherein in a top view, a boundary of the optical coupler is located within a boundary of the transparent portion, and a surface area of the optical coupler is less than that of the transparent portion; and
a transparent encapsulation material disposed on the first die and laterally covering the second die.

12. The semiconductor package of claim 11, wherein a top-view shape of the optical coupler is the same as a top-view shape of the transparent portion.

13. The semiconductor package of claim 11, wherein the optical coupler comprises a plurality of first discrete portions, the transparent portion comprises a plurality of second discrete portions, and each of the second discrete portions overlaps one of the first discrete portions.

14. The semiconductor package of claim 11, wherein the optical coupler and the transparent portion have different top-view shapes.

15. The semiconductor package of claim 11, wherein a backside of the substrate of the second die is substantially leveled with a surface of the transparent portion of the second die.

16. The semiconductor package of claim 11, wherein a thickness of the transparent portion of the second die is less than that of the substrate of the second die.

17. A semiconductor package, comprising:
a first die comprising an optical coupler;
a second die disposed on the first die, the second die comprising a substrate, the substrate comprising an interior region filled with a transparent portion, the transparent portion being optically communicated with the optical coupler; and a transparent encapsulation material disposed on the first die and physically connected to the substrate of the second die.

18. The semiconductor package of claim 17, wherein an area vertically between the optical coupler and the transparent portion is free of conductive features.

19. The semiconductor package of claim 17, wherein the second die further comprises a conductive feature bypassing an area underlying the transparent portion and bonded to the first die.

20. The semiconductor package of claim 17, wherein a material of the transparent portion is the same as a material of the transparent encapsulation material.

* * * * *